US012322574B2

(12) United States Patent
Sharda et al.

(10) Patent No.: US 12,322,574 B2
(45) Date of Patent: Jun. 3, 2025

(54) SYSTEM FOR GROWTH OF ONE OR MORE CRYSTALLINE MATERIALS

(71) Applicant: Sigma Carbon Technologies, Rajasthan (IN)

(72) Inventors: Tarun Sharda, Rajasthan (IN); Rajneesh Bhandari, Rajasthan (IN)

(73) Assignee: Sigma Carbon Technologies, Rajasthan (IN)

( * ) Notice: Subject to any disclaimer, the term of this patent is extended or adjusted under 35 U.S.C. 154(b) by 338 days.

(21) Appl. No.: 17/209,480

(22) Filed: Mar. 23, 2021

(65) Prior Publication Data

US 2022/0084793 A1   Mar. 17, 2022

(30) Foreign Application Priority Data

Sep. 13, 2020   (IN) .............................. 202011039555

(51) Int. Cl.
*H01J 37/32* (2006.01)
*C23C 16/511* (2006.01)
(Continued)

(52) U.S. Cl.
CPC ...... *H01J 37/32266* (2013.01); *C23C 16/511* (2013.01); *C30B 29/04* (2013.01);
(Continued)

(58) Field of Classification Search
CPC ............... H01J 37/32082–32311; H01J 37/32917–3299; C23C 16/511; C30B 29/04; C30B 25/00
See application file for complete search history.

(56) References Cited

U.S. PATENT DOCUMENTS 5,387,288 A * 2/1995 Shatas ................ H01J 37/3222
                                                    118/712
6,238,937 B1 * 5/2001 Toprac ................ C07K 14/195
                                                    257/E21.528
(Continued)

OTHER PUBLICATIONS

N.G. Ferreira, et al. "OES study of the plasma during CVD diamond growth using CCl4/H2/O2 mixtures." Diamond and Related Materials 9 (2000) 368-372. (Year: 2000).*
(Continued)

*Primary Examiner* — Kurt Sweely
(74) *Attorney, Agent, or Firm* — Kunzler Bean & Adamson

(57) ABSTRACT

The invention provides a system for growth of one or more crystalline materials, specifically diamonds. The system comprises a microwave generator integrated with a pressure controller and an Optical Emission Spectrometer (OES) to form an Integrated Microwave Generator System (IMGS). The OES provides a real-time feedback loop to an IMGS controller based on microwave plasma input from a microwave plasma reactor, to control one or more parameters (power, pressure, power density, and pulsed power) in a closed loop and maintain required proposition of plasma constituents for the growth of diamonds in the microwave plasma reactor. The OES monitors real-time concentration of plasma constituents just above the growing surface of diamonds and feeds the real-time information to the IMGS controller to automatically adjust power density to maintain the concentration of plasma constituents on the growing surface of diamonds.

8 Claims, 6 Drawing Sheets

(51) Int. Cl.
*C30B 25/00* (2006.01)
*C30B 29/04* (2006.01)

(52) U.S. Cl.
CPC ... H01J 37/32192 (2013.01); H01J 37/32311 (2013.01); H01J 37/32972 (2013.01); *C30B 25/00* (2013.01); *H01J 37/32201* (2013.01)

(56) References Cited

U.S. PATENT DOCUMENTS

| | | | | |
|---|---|---|---|---|
| 7,503,996 | B2* | 3/2009 | Chen | H03H 11/34 |
| | | | | 118/723 VE |
| 7,662,441 | B2* | 2/2010 | Gicquel | C30B 29/04 |
| | | | | 427/573 |
| 8,747,963 | B2* | 6/2014 | D'Evelyn | C23C 16/45578 |
| | | | | 427/249.7 |
| 9,487,858 | B2* | 11/2016 | Asmussen | C30B 25/08 |
| 10,008,370 | B2* | 6/2018 | Ohmori | H01J 37/32917 |
| 2010/0126406 | A1 | 5/2010 | Yan et al. | |
| 2010/0189924 | A1* | 7/2010 | D'Evelyn | H01J 37/32192 |
| | | | | 427/575 |
| 2015/0218694 | A1* | 8/2015 | Xu | C23C 28/04 |
| | | | | 428/206 |
| 2015/0318148 | A1* | 11/2015 | Chen | H01J 37/32201 |
| | | | | 315/39 |
| 2017/0009376 | A1* | 1/2017 | Khan | C30B 25/105 |
| 2017/0137944 | A1* | 5/2017 | Kubota | H01J 37/3244 |
| 2018/0294143 | A1* | 10/2018 | Chua | H01J 37/3299 |

OTHER PUBLICATIONS

Ferreira, et al. "Evidence of the enhanced atomic hydrogen production with halogens in diamond MWPACVD" Diamond and Relat. Mat. 7 (1998) 81-87. (Year: 1998).*

K.W. Hemawan et al., "Optical emission diagnostics of plasmas in chemical vapor deposition of single-crystal diamond", Journal of Vacuum Science & Technology A: Vacuum, Surfaces, and Films, 33(6), 061302. 03, Aug. 2015, pp. 1-20.

PCT/IN2021/050146, "Notification of Transmittal of the International Search Report and the Written Opinion of the International Searching Authority, or the Declaration", May 28, 2021, pp. 1-10.

* cited by examiner

SYSTEM FOR GROWTH OF ONE OR MORE CRYSTALLINE MATERIALS

FIELD OF THE INVENTION

The invention generally relates to a system for growing one or more crystalline materials, specifically diamonds using Microwave Plasma Chemical Vapor Deposition (MPCVD), which provides dramatic improvement in the quality and production yield of diamonds. More specifically, the invention relates to a specially configured Integrated Microwave Generator System (IMGS) which replaces individual devices such as a microwave source and pressure controller in the MPCVD system to produce high-quality diamonds.

BACKGROUND OF THE INVENTION

Chemical Vapor Deposition (CVD) diamond film finds numerous applications in industry due to its outstanding properties such as, but not limited to, high mechanical hardness, high thermal conductivity, wide band gap, low thermal expansion, and high optical transparency. This combination of extreme properties of diamond makes it the most important material for new generation technologies in the $21^{st}$ century. The growth or coating of diamond over large areas at sub-atmospheric pressures by CVD is a well-established method to produce diamond in various forms.

Although diamond growth at sub-atmospheric pressures is not well defined, the basic understanding of the role of atomic hydrogen in the gas phase has helped in developing relevant CVD diamond technologies. Hydrogen is dissociated into atomic hydrogen that plays a key role in the growth of diamond by dissociating hydrocarbons into diamond precursors for the growth and etching the simultaneously growing unwanted sp2 carbon impurities. The sp2 carbon impurities in the growth may further develop growth defects and stress in the material.

Erstwhile systems disclose several methods for preparation of CVD diamonds and among them Microwave Plasma Chemical Vapor Deposition (MPCVD) is most widely used, especially for the growth of high-quality diamonds at high growth rates, including growth of single crystalline diamonds.

In conventional systems, there are two kinds of sources for the generation of plasma namely magnetron tubes and chip-based microwave generator. The magnetron tubes (microwave tubes) use kinetic energy and convert the kinetic energy into electromagnetic energy, which can be used as plasma. However, the structure of the magnetron tubes and the generation of microwave power using the magnetron tubes, are quite complex and the associated parameters are difficult to control. Apart from this, magnetron tubes are expensive, have frequency deviation (with time and power output), power output deviation (with time) and a short lifespan that requires changing the magnetron tubes at regular intervals during the lifetime of an MPCVD system for the growth of diamond.

Due to frequent frequency fluctuations, the growth of CVD diamonds results in growth defects and dislocations that result in poor quality of diamonds being produced. Therefore, a highly stable frequency produces a highly stable plasma which results in high-quality diamond growth with much lower levels of defects and dislocations.

Another problem is encountered during long run thick growth of a diamond. As the thickness of the diamond increases, it affects the plasma and changes the proposition of the plasma constituents. Maintaining the proposition of the plasma constituents during diamond growth and as the thickness of the diamond increases, is very critical to provide a high-quality uniform growth of thick single and polycrystalline diamond. It is of utmost importance that the consistency of the quality over thickness and large areas are to be maintained.

Conventional methods using magnetron tube-based MPCVD system observe the temperature of the growing surface of diamond using an optical pyrometer and vary either the microwave power and/or other growth parameters such as pressure, to maintain the desired growing surface temperature constant.

In MPCVD-based systems, the source of generation of microwave power in the allowed frequencies of 915 MHz and 2450 MHz is the magnetron tube, which is a vacuum electron device. However, the magnetron tube is quite complicated because of its mechanical geometry. It consists of a cathode at its center that is surrounded by a ring-shaped anode with holes or slots cut into cavities or resonant cavities. There is also a powerful magnet placed underneath the anode to generate a magnetic field in a manner that electrons originating from the cathode and accelerating towards the anode feel a force and follow a curved path between the cathode and anode. The cavities in the anode resonate and emit microwave radiation of frequency that they are designed for. Due to this, the stability of frequency and power output of a magnetron tube depends on the mechanical dimensions of the cavities. Moreover, there are many reasons for a low lifespan of a magnetron tube which includes, but is not limited to, the inefficient characteristics of the filament, vacuum, and arcing.

Furthermore, a slight shift in frequency such as for example, by 10 MHz, and power variation with time, strongly affect the electric field distribution and density of electrons in the plasma in an MPCVD-based system. This, in turn, affects the concentration of hydrogen atoms in the plasma and thus the growth of diamond because the former plays a key role in its growth. The fluctuation in the concentration of hydrogen and/or in the concentration of hydrogen/carbon (H/C) result in incorporating sp2 carbon impurities and related growth defects in the diamond.

Therefore, the microwave/magnetron tubes-based MPCVD system for diamond growth have certain disadvantages in the growth of diamond due to factors such as, but not limited to, the following: frequency shift with time (during a single long run of growth and during its entire lifetime) and power, power stability with time (during a single long run of growth and during its entire lifetime), expensive and short lifetime, and a tube to tube frequency variation.

The aforesaid factors not only limit the processing window of growth of diamonds of all forms and types by MPCVD, but also make their production cost substantially quite high.

Therefore, in light of the above, there exists a need for an improved system which addresses the above mentioned limitations of existing systems for diamond growth, by generating microwave power with extreme controls over frequency and power using semiconductor devices and software, which is further coupled with process monitoring of plasma constituents.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the invention.

Figure 1:
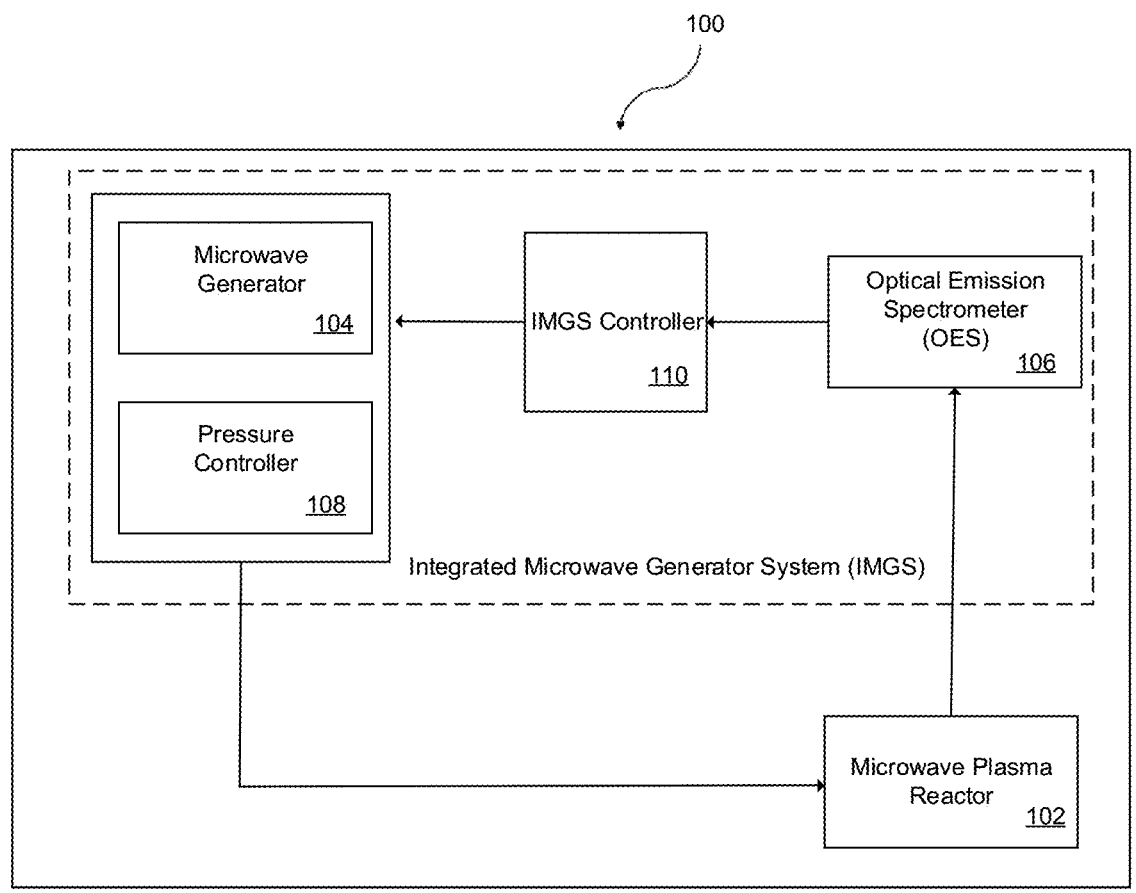
FIG. 1 illustrates a Microwave Plasma Chemical Vapor Deposition (MPCVD) system for growing one or more crystalline materials in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION OF THE INVENTION

Before describing in detail embodiments that are in accordance with the invention, it should be observed that the embodiments reside primarily in combinations of method steps and system components related to an Integrated Microwave Generator System (IMGS) which replaces individual devices such as a microwave source and pressure controller in a Microwave Plasma Chemical Vapor Deposition (MPCVD) system to produce high-quality diamonds.

Accordingly, the system components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article or composition that comprises a list of elements does not include only those elements but may include other elements not expressly listed or inherent to such process, method, article or composition. An element proceeded by "comprises . . . a" does not, without more constraints, preclude the existence of additional identical elements in the process, method, article or composition that comprises the element.

Various embodiments of the invention provide a system for growing one or more crystalline materials. The one or more crystalline materials can be, but need not be limited to, Diamonds, Carbon Nitride, Boron Nitride, Silicon Nitride, Gallium Nitride, Silicon, Silicon Dioxide, Silicon Carbide, Zirconia, Tin Selenide, Gallium Oxide Whiskers and Nanowires, Carbon Nanotubes, Zinc Oxide Nanowires, and Graphene.

An object of the invention is to provide a Microwave Plasma Chemical Vapor Deposition (MPCVD)-based system for the growth of nano-crystalline, polycrystalline and single crystalline forms of diamonds of electronic grade, detector grade, optical grade, thermal grade, mechanical grade or combinations thereof.

Another object of the invention is for the growth of diamonds without the need of direct temperature control by an optical pyrometer.

Yet another object of the invention is for the growth of diamonds with a precision of 1% or lower variation in the normalized concentration of plasma constituents.

Yet another object of the invention is for the growth of low birefringence high-quality single crystalline electronic grade diamond with low birefringence on any type of diamond seed.

Yet another object of the invention is for the growth of optical grade single crystalline diamond for gem and other applications with high growth rates in larger areas and without any post growth treatment such as low pressure high temperature or high pressure high temperature.

To achieve the above-mentioned objectives, the invention provides a Microwave Plasma Chemical Vapor Deposition (MPCVD) system for growth of one or more crystalline materials. The one or more crystalline materials are contained in a microwave plasma reactor of the MPCVD system. The MPCVD system further comprises a microwave generator integrated with an Optical Emission Spectrometer (OES), and a pressure controller to form an Integrated Microwave Generator System (IMGS). The OES provides a real-time feedback loop to an IMGS controller based on microwave plasma input from the microwave plasma reactor, to control one or more parameters in a closed loop and maintain required proposition of plasma constituents for the growth of diamonds in the microwave plasma reactor. The one or more parameters can be, but need not be limited to, power, pressure, power density, and pulsed power. The plasma constituents include one or more of atomic hydrogen, OH, $N_2$, CN, H$\delta$, $C_xH_y$, BH, H$\gamma$, CO, $H_2$, $C_2$, H$\beta$, $CO^+$, $O_2^+$, H$\alpha$, $O_2$, O, and Ar. In an embodiment, the MPCVD system is used for the growth of nano-crystalline, polycrystalline, and single crystalline forms of diamonds of electronic grade, detector grade, optical grade, thermal grade, mechanical grade or combinations thereof. The OES monitors real-time concentration of plasma constituents just above the growing surface of diamonds and feeds the real-time information to the IMGS controller to automatically adjust power density to maintain the concentration of plasma constituents on the growing surface of diamonds. The IMGS is also facilitated with a function of providing a pulsed power output in a precisely controlled manner of the peak power with duty cycle. The function when integrated with the plasma constituents concentration feed, improves three-dimensional uniformity of the growth of diamonds.

FIG. 1 illustrates an MPCVD system 100 for growing one or more crystalline materials in accordance with an embodiment of the invention.

The one or more crystalline materials can be, but need not be limited to, Diamonds, Carbon Nitride, Boron Nitride, Silicon Nitride, Gallium Nitride, Silicon, Silicon Dioxide, Silicon Carbide, Zirconia, Tin Selenide, Gallium Oxide Whiskers and Nanowires, Carbon Nanotubes, Zinc Oxide Nanowires, and Graphene.

As illustrated in FIG. 1, MPCVD system 100 includes a microwave plasma reactor 102 which contains the one or more crystalline materials.

In an embodiment, the one or more crystalline materials are placed in a Chemical Vapor Deposition (CVD) chamber of MPCVD system 100, that is positioned to reflect the microwave radiation for sustaining the high-density plasma inside the CVD chamber on which the growth happens. One or more crystalline material seeds (for example, diamond seeds) are placed in a substrate holder in the CVD chamber of MPCVD system 100 and is exposed to microwave radiation for generating plasma under conditions to facilitate growth on the one or more crystalline material seeds.

MPCVD system 100 further includes a microwave generator 104 integrated with an Optical Emission Spectrometer (OES) 106 and a pressure controller 108 to form an Integrated Microwave Generator System (IMGS). Microwave generator 104 is either a chip-based microwave generator or a magnetron tube-based microwave generator for the generation of plasma.

OES 106 provides a real-time feedback loop to an IMGS controller 110 based on microwave plasma input from microwave plasma reactor 102, to control one or more parameters in a closed loop and maintain required proposition of plasma constituents for the growth of the one or more crystalline materials in microwave plasma reactor 102. The one or more parameters can be, but need not be limited to, power, pressure, power density, and pulsed power. The plasma constituents include one or more of atomic hydrogen, OH, $N_2$, CN, H$\delta$, $C_xH_y$, BH, H$\gamma$, CO, $H_2$, $C_2$, H$\beta$, $CO^+$, $O_2^+$, H$\alpha$, $O_2$, O, and Ar.

In accordance with an embodiment, MPCVD system 100 is used for the growth of nano-crystalline, polycrystalline and single crystalline forms of diamonds of electronic grade, detector grade, optical grade, thermal grade, mechanical grade or combinations thereof.

OES 106 monitors real-time concentration of plasma constituents just above the growing surface of diamonds and feeds the real-time information to IMGS controller 110 to automatically adjust power density to maintain the concentration of plasma constituents on the growing surface of diamonds.

The IMGS is also facilitated with a function of providing a pulsed power output in a precisely controlled manner of the peak power with duty cycle. The function when integrated with the plasma constituents concentration feed, improves three-dimensional uniformity of the growth of diamonds.

In an embodiment, MPCVD system 100 is used for the growth of diamonds without the need of direct temperature control by an optical pyrometer.

In another embodiment, MPCVD system 100 is used for the growth of diamonds with a precision of 1% or lower variation in the normalized concentration of plasma constituents.

In yet another embodiment, MPCVD system 100 is used for the growth of low birefringence high-quality single crystalline electronic grade diamond with low birefringence on any type of diamond seed.

In yet another embodiment, MPCVD system 100 is used for the growth of optical grade single crystalline diamond for gem and other applications with high growth rates in larger areas and without any post growth treatment such as low pressure high temperature or high pressure high temperature.

Further, the IMGS provides the same microwave power, precisely tunable within 50 MHz, of the specified frequency of 2450 MHz and 915 MHz as output, which helps in optimizing production yield of each MPCVD unit, and stabilizes the batch to batch production in a single MPCVD unit and from unit to unit.

Figure 2:
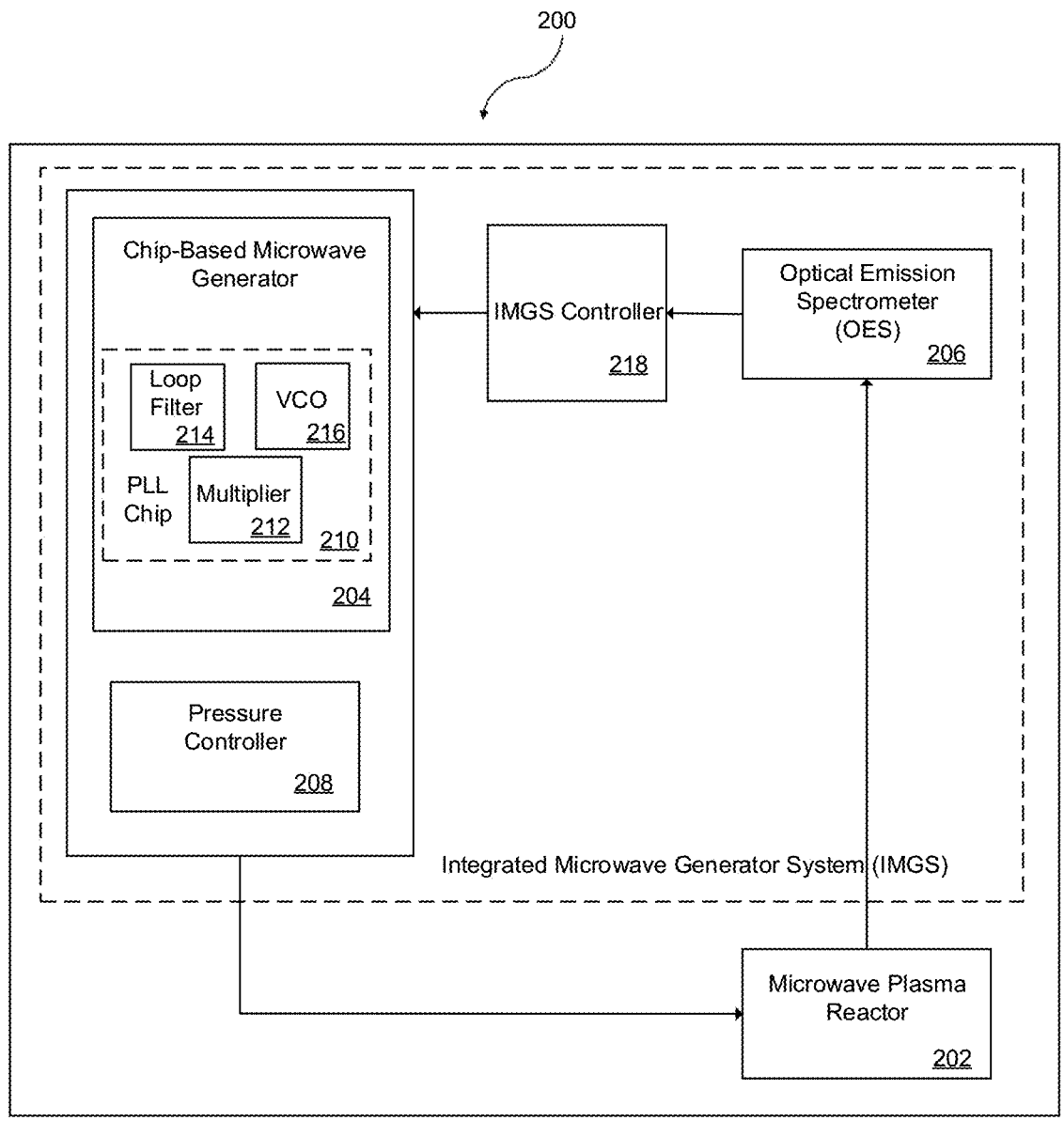
FIG. 2 illustrates an MPCVD system comprising a chip-based microwave generator for growing one or more crystalline materials in accordance with an embodiment of the invention.

FIG. 2 illustrates an MPCVD system 200 comprising a chip-based microwave generator for growing one or more crystalline materials in accordance with an embodiment of the invention.

As illustrated in FIG. 2, MPCVD system 200 includes a microwave plasma reactor 202 which contains the one or more crystalline materials.

In an embodiment, the one or more crystalline materials are placed in a CVD chamber of MPCVD system 200, that is positioned to reflect the microwave radiation for sustaining the high-density plasma inside the CVD chamber on which the growth happens. One or more crystalline material seeds (for example, diamond seeds) are placed in a substrate holder in the CVD chamber of MPCVD system 200 and is exposed to microwave radiation for generating plasma under conditions to facilitate growth on the one or more crystalline material seeds.

MPCVD system 200 further includes a chip-based microwave generator 204 integrated with an OES 206 and a pressure controller 208 to form the IMGS.

Chip-based microwave generator 204 includes a set of semiconductor chips and devices for generating microwave frequencies. The set of semiconductor chips and devices includes one or more voltage-controlled oscillators (VCOs) and a phase-locked loop (PLL) chip 210.

PLL chip 210 comprises a negative feedback system comprising a multiplier 212, a loop filter 214 and a VCO 216 connected to provide the feedback in a loop. VCO 216 generates a sine wave and its frequency is determined by an external applied voltage.

OES 206 provides a real-time feedback loop to an IMGS controller 218 based on microwave plasma input from microwave plasma reactor 202, to control one or more parameters in a closed loop and maintain required proposition of plasma constituents for the growth of the one or more crystalline materials in microwave plasma reactor 202. The one or more parameters can be, but need not be limited to, power, pressure, power density, and pulsed power. The plasma constituents include one or more of atomic hydrogen, OH, $N_2$, CN, H$\delta$, $C_xH_y$, BH, H$\gamma$, CO, $H_2$, $C_2$, H$\beta$, $CO^+$, $O_2^+$, H$\alpha$, $O_2$, O, and Ar.

Thus, the IMGS replaces individual devices, a microwave source, and a pressure controller in MPCVD systems to grow diamonds.

The IMGS produces a highly stable frequency of 2.45 GHz and 915 MHz that does not vary with time and power and the power output is controlled automatically based on the real-time feedback of plasma constituents. Further, the power output of the IMGS can be pulsed and tuned for its frequency, unit to unit, for optimized production yield of the entire production plant.

The IMGS maintains the concentration of hydrogen atoms on the growing surface of diamonds that eventually heats up the growing surface and results in the growth temperature. OES 206 is used to monitor a real-time concentration of various plasma constituents such as, but not limited to, OH, $N_2$, CN, H$\delta$, $C_xH_y$, BH, H$\gamma$, CO, $H_2$, $C_2$, H$\beta$, $CO^+$, $O_2^+$, H$\alpha$, $O_2$, O, and Ar. The CVD growth of diamonds is mainly governed by atomic hydrogen in the gas phase. In addition to generating methyl radicals as diamond precursors and preferentially etching the sp2 carbon from the growing surface, the IMGS also helps in delivering a high temperature on the growing surface by dissociating the bonded hydrogen from the growing surface. In general, as the diamond grows thicker, the growth temperatures changes. The temperature is monitored through an optical pyrometer and is maintained. OES 206 monitors a real-time concentration of hydrogen atoms just above the growing surface of the diamond and the real-time information is fed to IMGS controller 218 to automatically adjust the power density to maintain the atomic hydrogen concentration on the growing surface.

Further, the IMGS is also facilitated with a function of providing a pulsed power output in a precisely controlled manner of the peak power with duty cycle. This function, when integrated with the hydrogen concentration feed, greatly helps in improving three-dimensional uniformity of the growth of diamonds.

In accordance with an embodiment, MPCVD system 200 is used for the growth of nano-crystalline, polycrystalline and single crystalline forms of diamonds of electronic grade, detector grade, optical grade, thermal grade, mechanical grade or combinations thereof. This growth using IMGS-based MPCVD system 200 is compared with the growth using the conventional magnetron tube-based MPCVD system. For quality assessment, the growth is characterized by Raman, Photoluminescence (PL) and by cross-polarization birefringence microscopy.

Based on the comparison, it is determined that IMGS-based MPCVD system 200 achieves several benefits in the growth, production, and cost of diamonds. A more precise and automatic control of the growth parameters delivers: a long run uninterrupted growth with a reproducibility of more than 99% of production yield from MPCVD unit to unit, and a wider growth window that is independent of direct growth temperature measurement from the optical pyrometer.

Further, single crystalline electronic or detector grade diamonds may be grown on any kind of single crystalline substrates, that is, without the need of low stress diamond substrates. Furthermore, optical grade single crystalline diamond for gem and other applications may be grown at high growth rates in larger areas and can be used for many applications including gem without any post growth treatment such as low pressure high temperature or high pressure high temperature. The production yield of all forms of diamonds, single or polycrystalline, increases by at least 200% using IMGS-based MPCVD system 200.

The above-mentioned aspects are further illustrated in detail in conjunction with various embodiments.

In an embodiment, IMGS-based MPCVD system 200 of 2450 MHz, 915 MHz is used. A comparison of nano-crystalline, polycrystalline, and single crystalline diamond grown using IMGS-based MPCVD system 200 with a feedback control from OES 206 demonstrates that a feedback control of minimum power density change can be done with a variation of 0.25% or lower concentration of atomic hydrogen.

On the other hand, a comparison of nano-crystalline, polycrystalline and single crystalline diamond grown using IMGS-based MPCVD system 200 with a feedback control from OES 206 demonstrates that a feedback control of minimum power change can be done with a variation of 0.25% or lower concentration of atomic hydrogen and IMGS-based MPCVD system 200 can be run uninterruptedly for hundreds of hours of diamond growth automatically without the need of an optical pyrometer.

To demonstrate this, firstly, the conventional 2450 MHz, 915 MHz MPCVD system is used in which diamond growth of all forms and grades are carried out. This growth by conventional means requires to observe the growth temperature at a certain location from the entire deposition area and based on this feedback, adjust the growth parameters as and when required for the entire run of hundreds of hours. This method is limited by minimum measurable temperature variation of the optical pyrometer device which more importantly, is a representative reference parameter of the entire growth area to control the growth.

To compare this conventional method with the adjustment of the growth parameters automatically by IMGS-based MPCVD system 200 with the continuous feedback from OES 206 from the close vicinity of the growing surface, a set of samples, both for polycrystalline and single crystalline diamonds, are deposited at the same recipe (as used in the case of conventional growth) while allowing the IMGS to adjust and maintain the power density within 0.25 to 5% of the normalized concentration of atomic hydrogen. No other conditions set for both the forms of diamond are changed. A different concentration of hydrogen may be used while growing different forms of diamond such as poly and single crystalline. For the polycrystalline, the chosen recipe is such that some amount of sp2 carbon is embedded in it. This choice helps in analyzing the fine variation in the quality while controlling the hydrogen concentration to a fine level by the IMGS. On the other hand, the recipe chosen for single crystalline growth is an optical grade one, whose Full Width Half Maxima (FWHM) of diamond line in a high resolution Raman Spectroscopy is a good criteria to analyze the quality of the growth, especially in terms of growth defects or dislocations.

The set of samples deposited in both the cases, with and without IMGS-based MPCVD system 200, are grown at the same conditions. The frequency of adjustment used in the conventional process is the fastest possible frequency with a variation of growing surface temperature within ±1 degree. Although such a frequent adjustment in the power density of the process that runs for hundreds of hours is not practical, it represents a better simulation to compare with the automated IMGS process.

The samples are characterized by Raman Spectroscopy to investigate the variation in the quality. For the set of polycrystalline forms of the diamonds, the fine variation in the intensity of non-diamond carbon ($\sim$1450 cm$^{-1}$) with respect to the intensity of diamond line ($\sim$1333 cm$^{-1}$) is observed. For the set of single crystalline samples of the diamonds, the fine variation in the FWHM diamond line is observed. Both the spectra are depicted in FIG. 3 and FIG. 4, respectively.

Figure 3:
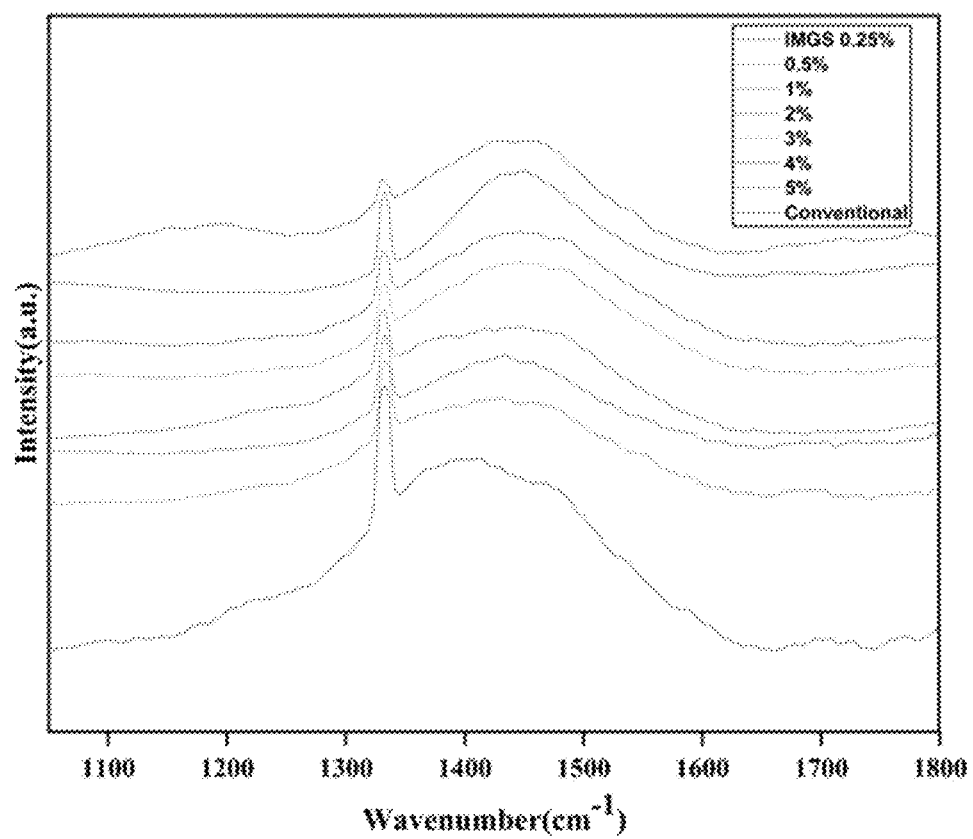
FIG. 3 is a graph illustrating Raman spectroscopy of polycrystalline diamonds.

FIG. 3 is a graph illustrating Raman spectroscopy of polycrystalline diamonds.

Figure 4:
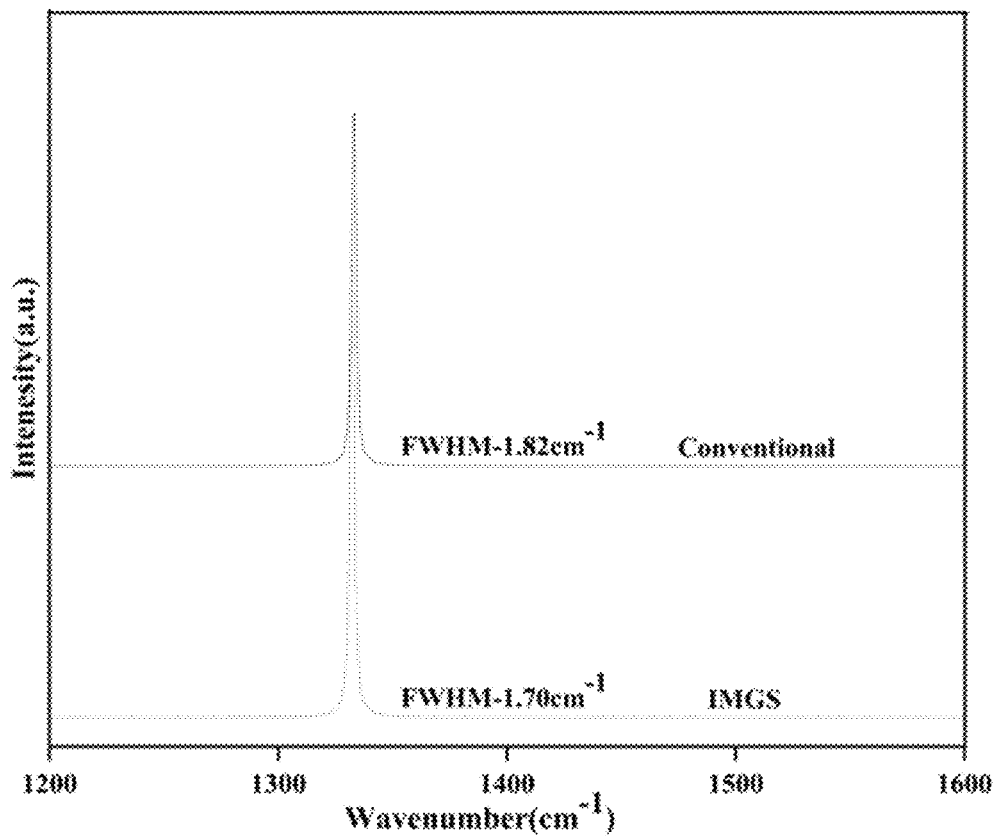
FIG. 4 is a graph illustrating Full Width Half Maxima (FWHM) for single crystalline diamonds.

FIG. 4 is a graph illustrating FWHM for single crystalline diamonds.

In both the cases, it is observed that although there is not much variation in the quality of the samples grown using IMGS-based MPCVD system 200 up to a variation of 0.5% of the hydrogen concentration, the quality deteriorates gradually when increasing the variation from 0.5% to 5% still being better than the samples grown at the same recipe in a magnetron tube-based MPCVD system while adjusting the growth parameters based on the feedback from the optical pyrometer but with a frequency of adjusting ±1 degree of the surface temperature.

It is also observed that the frequency of automatic adjustment of power density by the IMGS is more than 10 times greater than the frequency of adjustment using conventional methods. Further, the frequency of adjustment of the growth parameter in a 2450 MHz IMGS-based MPCVD system is more than a 915 MHz IMGS-based MPCVD system.

In another embodiment, using IMGS-based MPCVD system 200 of 2450 MHz, 915 MHz, a comparison of single crystal diamond quality of electronic grade from both magnetron tube-based MPCVD system and IMGS-based MPCVD system 200 is studied. In this case, it is to be shown that there is no need of a special substrate. In this embodiment, the growth of single crystalline high-quality electronic grade samples from conventional systems are compared to the growth of single crystalline high-quality electronic grade samples from IMGS-based MPCVD system 200. The high-quality electronic grade diamond contains extremely lower concentration of nitrogen and boron impurities (for example, <1 ppm). The growth is carried out on regular single crystal diamond seeds, that is, without any special preparation of selecting the diamond seeds for low birefringence and defects. The samples were characterized by Raman and PL spectroscopy and cross-polarized birefringence images are taken to investigate quality and amount of stress in the samples.

Figure 5:
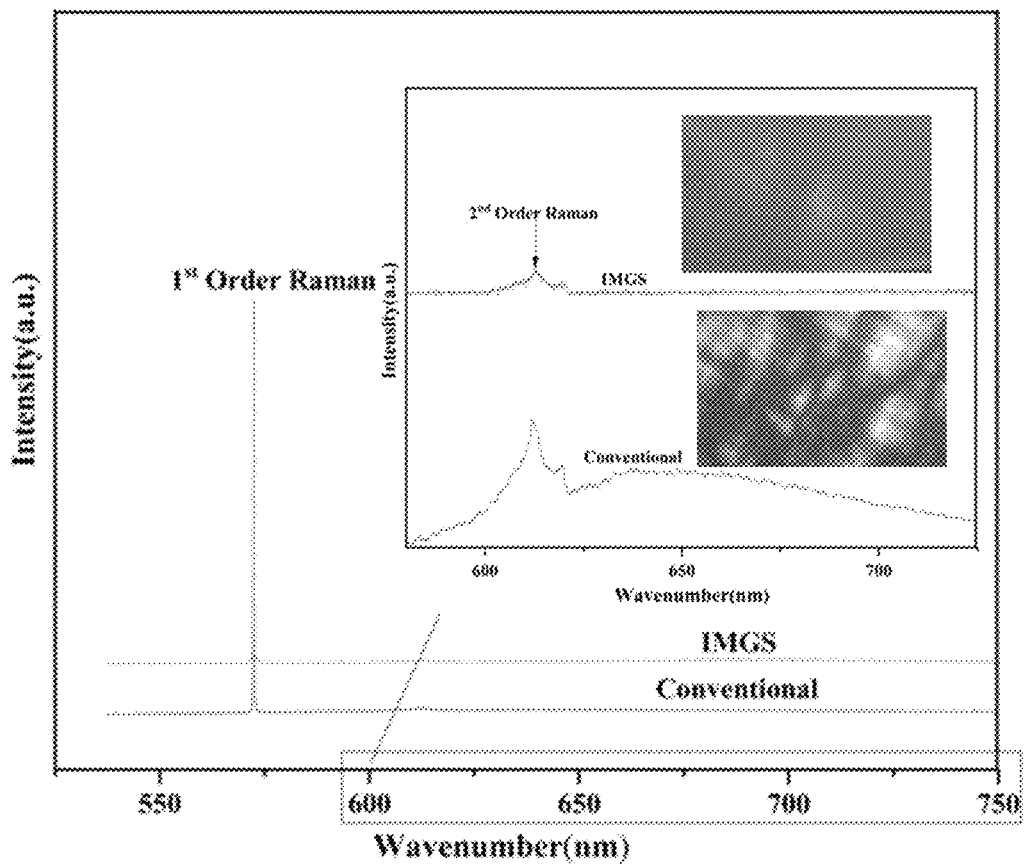
FIG. 5 is a graph illustrating Photoluminescence (PL) spectra and cross-polarized birefringence images of diamonds grown by a conventional system (magnetron tube-based MPCVD system) and an Integrated Microwave Generator System (IMGS)-based MPCVD system.

FIG. 5 is a graph illustrating PL spectra of the grown samples from the conventional magnetron tube-based MPCVD system and IMGS-based MPCVD system 200 along with their birefringence images in the inset.

Referring to FIG. 5, it is observed that both the samples are of high-quality with undetectable trace of boron and nitrogen impurities, however the cross-polarized birefringence images suggest that the conventionally grown samples using the magnetron tube-based system contain higher stress which is untraceable in samples from IMGS-based MPCVD system 200.

In yet another embodiment, using IMGS-based MPCVD system 200 of 2450 MHz, 915 MHz, a comparison of diamond quality of optical grade from both magnetron tube-based system and IMGS-based MPCVD system 200 is illustrated. In this case, it is to be shown that there is no need for any post growth treatment.

In this embodiment, growth of single crystalline high-quality optical grade samples from the conventional system is compared to growth of single crystalline high-quality optical grade samples from IMGS-based MPCVD system 200. The high-quality optical grade diamond contains low amount of nitrogen and boron impurities (~1 to 5 ppm). The growth was carried out with 10 to 100 ppm concentration of nitrogen in the gas phase to increase the growth rate (as compared to the growth rate of electronic grade diamond). These samples are characterized by PL spectroscopy.

Figure 6:
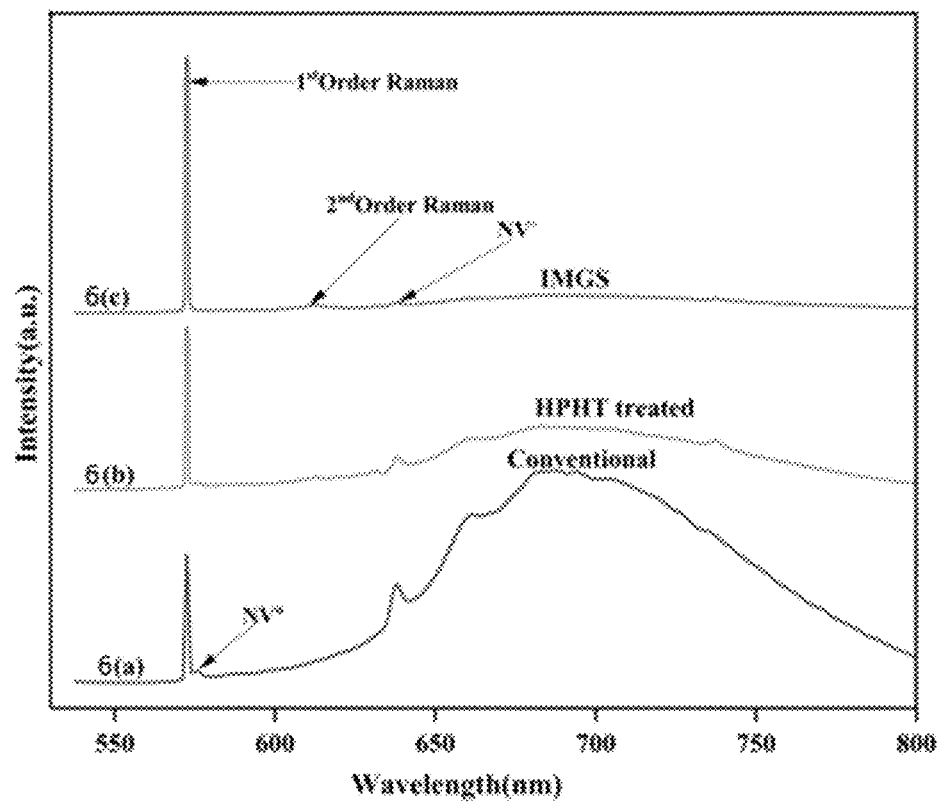
FIG. 6 illustrates graphs depicting PL spectra for conventional, high pressure and high temperature (HPHT) treated, and IMGS diamonds.

FIG. 6 illustrates graphs depicting PL spectra of the grown samples from the magnetron tube-based MPCVD system, with and without high pressure and high temperature (HPHT) annealing (FIGS. 6a and 6b, respectively) and IMGS-based MPCVD system 200 (FIG. 6c). Comparing the PL spectra of conventional and IMGS grown samples (FIGS. 6a and 6c, respectively), it is observed that the intensities of nitrogen-vacancy (NV) centers reduced dramatically from the conventionally grown samples to the samples grown using IMGS-based MPCVD system 200. Further, the conventionally grown samples are subjected to HPHT treatment and are characterized again by PL spectroscopy.

As can be seen, the spectra from FIG. 6b and FIG. 6c are quite comparable in terms of the intensities of NV centers, indicating that IMGS-based MPCVD system 200 produces high-quality optical grade diamonds that do not require post growth treatments including HPHT annealing.

On the other hand, when comparing a sample grown by IMGS-based MPCVD system 200 using approximately 5 times higher concentration of nitrogen in gas phase, the nitrogen concentration in terms of the intensities of NV centers appears to be the same as shown in FIG. 6a. This suggests that IMGS-based MPCVD system 200 allows introducing higher concentration of nitrogen in the gas phase to produce high growth rate optical grade diamonds. This in turn increases the growth rates of diamond in IMGS-based MPCVD system 200 by 50-200% to what is obtained conventionally using the magnetron tube-based MPCVD system.

Further, it is shown that every magnetron tube has a different frequency that results in a large variation of production yield from unit to unit, whereas using IMGS-based MPCVD system 200, every MPCVD unit may be tuned with a reproducibility of 99% or more of diamond yield.

Every magnetron tube comes with a unique frequency of its own and its unique characteristics with power. For example, every 2450 MHz tube comes with a unique frequency in the range of 2450±50 MHz. When a magnetron tube-based MPCVD unit is introduced, the optimized diamond yield from unit to unit varies based on the given frequency and its characteristics with power. Therefore, the optimized production yield of every magnetron tube-based unit remains limited and dependent on its magnetron tube frequency and its characteristics with power. This variation of the optimized yield can therefore vary up to 10% from magnetron tube-based MPCVD unit to unit. This variation was brought down to less than 1% from unit to unit of IMGS-based MPCVD system 200. Besides, optimization time of each unit of IMGS-based MPCVD system 200 decreases substantially because of a precise control on frequency. The precisely tunable frequency can be varied to align with the specific unit of IMGS-based MPCVD system 200.

In yet another embodiment, it is shown that uniformity and growth area of diamonds of single and polycrystalline forms increased at least by 200% by replacing magnetron tubes by the IMGS in MPCVD systems. In this case, the function of pulse is used.

Every MPCVD unit is designed with cooling arrangements of not only the cavity but also of the cooling substrate stage. The cavity thermal management decides the maximum power that can be used to generate plasma at any growth pressure. This power limit in turn limits the available power for processing diamond on the cooled substrate stage.

In this embodiment, large area polycrystalline and single crystalline diamonds are grown by the magnetron tube-based MPCVD system using their maximum power respectively for frequency of 2450 MHz and 915 MHz. The production yield for each unit is calculated by estimating the entire volume of diamond that was produced at the maximum power in continuous wave (CW) in the magnetron tube-based MPCVD system at various recipes. Using the same recipes in the same MPCVD units, diamonds are then grown by replacing magnetron tube-based microwave generator and pressure controller with the IMGS while applying the function of pulsing the output power in a manner that peak pulse power is much higher than the above mentioned CW power but with the same averaged power that the cavity is meant to sustain. This mode of power output and its fine control without any effect on the microwave frequency in the IMGS helps in increasing the plasma size without overheating the cavity and the required growth temperature to what the recipes need. The same set of recipes are used for diamond growth in IMGS-based MPCVD system 200 with much higher pulsed plasma peak power and the production yield is calculated from the volume of the diamond grown at each recipe and compared with the volume grown by the magnetron tube-based MPCVD system. The enhanced plasma area not only helps in increasing the growth area but also helps in bringing much better uniformity over the larger growth area. It is also found that the IMGS-based MPCVD recipes delivered more than 200% production yield as compared to the magnetron tube-based MPCVD system for the same growth conditions, including the average power.

In yet another embodiment, the window of diamond growth is widened by IMGS-based MPCVD system 200. It is shown that the control on the process parameters are carried out by a feedback from OES 206 to IMGS controller 218 and is made independent from pyrometer monitoring, the process window of diamond growth being widened. For instance, by replacing the magnetron tube with the IMGS, single crystal diamonds can be grown at pressures as low as 70 Torr, which in turn, allows to expand the growth area and provide large area uniformity of the growth surface of diamonds.

The present invention is advantageous in that it addresses limitations in stability of frequency and power and higher operational cost by implementing an alternate methodology of generating microwave power with extreme controls over frequency and power by using semiconductor devices and software and integrating it with process monitoring of the plasma constituents.

Instead of using a mechanical geometry for the microwave frequency generation, the chip-based generator of microwave frequencies uses semiconductor devices in which the frequency is produced by a set of semiconductor chips and devices—a VCO and a PLL chip. The PLL is a negative feedback system that consists of three components—a multiplier, a loop filter, and a VCO that are connected to provide the feedback as a loop. VCO generates the sine wave and its frequency is determined by an external applied voltage.

A main objective of the present invention is to produce a high-quality diamond by MPCVD process at low and affordable cost. This objective is achieved by replacing individual devices, such as the microwave source and the pressure controller, by the IMGS in the MPCVD system.

In the present invention, the chip-based generator and the pressure controller are integrated with the OES that provides a real-time feedback to the IMGS controller to control the process power density in a closed loop. The integration of the chip-based generator and the pressure controller with the OES, allows to maintain the required proposition of the plasma constituents automatically during growth. The precisely stable frequency with time and power and maintaining the desired proposition of the plasma constituents automatically through the IMGS results in a dramatic improvement in the quality and production yield of all forms of diamonds such as nano-crystalline, polycrystalline and single crystalline forms of electronic grade, detector grade, optical grade, thermal grade, mechanical grade or combinations thereof Further, the IMGS is used to apply power density in a precisely controlled pulse with much higher peak power while maintaining the average power output to be the same as what the operation chamber can sustain. The additional advantage of having higher peak power in pulsed form is enlarging the plasma area without overheating of the process reactor and substrates. This results in increasing production yield of high-quality diamonds multifold.

Another advantage of the IMGS is that it provides the same microwave power within 50 MHz of the specified frequency (of 2450 MHz and 915 MHz). This fine adjustment of the output frequency helps in optimizing the production yield of each MPCVD unit, thus not only increasing the overall production yield from a production plant of a large set of multiple units but also stabilizing the batch to batch production in a single unit and from unit to unit.

In summary, the present invention replaces the individual devices, microwave source and the pressure controller with the IMGS for the growth of single and polycrystalline diamonds and provides the following benefits to CVD diamond growth: high-quality growth with much higher production yield, and with no requirements of prior or post growth conditions or treatment for improving the growth quality and cost effectiveness of the production plant and the product.

These benefits allow production of all forms of diamond, from nano-crystalline, polycrystalline and single crystalline forms of electronic grade, detector grade, optical grade, thermal grade, mechanical grade or combinations thereof, and are cost effective for all the applications of diamond.

Those skilled in the art will realize that the above recognized advantages and other advantages described herein are merely exemplary and are not meant to be a complete rendering of all of the advantages of the various embodiments of the invention.

The system, as described in the invention or any of its components may be embodied in the form of a computing device. The computing device can be, for example, but not limited to, a general-purpose computer, a programmed microprocessor, a micro-controller, a peripheral integrated circuit element, and other devices or arrangements of devices, which can implement the steps that constitute the method of the invention. The computing device includes a processor, a memory, a nonvolatile data storage, a display, and a user interface.

In the foregoing specification, specific embodiments of the invention have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of the invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A system for growing one or more crystalline materials, the system comprising:
   a microwave plasma reactor comprising a Chemical Vapor Deposition (CVD) chamber configured to contain one or more crystalline material seeds having a growing surface configured to grow a crystalline material, wherein the crystalline material requires a defined proposition of plasma constituents to grow; and
   an Integrated Microwave Generator System (IMGS) configured to control, continuously and in real-time, a plurality of parameters necessary to maintain the defined proposition of plasma constituents, wherein the plurality of parameters comprises a power density, the IMGS comprising:
a chip-based microwave generator;
a pressure controller;
an IMGS controller; and
an optical emission spectrometer (OES) configured to provide a real-time feedback loop to the IMGS controller based on microwave plasma input from the microwave plasma reactor, the OES comprising;
a processor;
a non-transitory computer readable medium in electronic communication with the processor; and
instructions stored in the memory, the instructions being executable by the processor to:
receive, continuously and in real-time, microwave plasma input from the microwave plasma reactor;
monitor, continuously and in real-time, a concentration of atomic hydrogen and at least two plasma constituents above the growing surface, wherein the at least two plasma constituents are selected from the group consisting of OH, $N_2$, CN, H$\delta$, $C_xH_y$, BH, H$\gamma$, CO, $H_2$, $C_2$, H$\beta$, CO+, $O_{2+}$, H$\alpha$, $O_2$, O, and Ar;
generate, in real-time, feedback based on the concentration of the atomic hydrogen and the at least two plasma constituents; and
automatically adjust the power density in response to the feedback to control the atomic hydrogen concentration on the growing surface and to maintain the defined proposition of plasma constituents,
wherein the IMGS is configured to automatically adjust the power density in response to a variation in the atomic hydrogen concentration of 0.25% or less.

2. The system of claim 1, wherein the microwave plasma reactor is configured to contain one or more crystalline seeds configured to grow a crystalline material selected from the group consisting of Diamonds, Carbon Nitride, Boron Nitride, Silicon Nitride, Gallium Nitride, Silicon, Silicon Dioxide, Silicon Carbide, Zirconia, Tin Selenide, Gallium Oxide Whiskers and Nanowires, Carbon Nanotubes, Zinc Oxide Nanowires, and Graphene.

3. The system of claim 1, wherein the defined atomic hydrogen concentration is selected to grow a low birefringence high-quality single crystalline electronic grade diamond.

4. The system of claim 1, wherein the defined atomic hydrogen concentration is selected to grow an optical grade single crystalline diamond.

5. The system of claim 1, wherein the IMGS is configured to provide microwave power within 50 MHz of one of 2450 MHz and 915 MHz.

6. The system of claim 1, wherein the chip-based microwave generator comprises a set of semiconductor chips and devices for generating microwave frequencies, wherein the set of semiconductor chips and devices comprises at least one of a voltage-controlled oscillator (VCO) and a phase-locked loop (PLL) chip.

7. The system of claim 6, wherein the PLL chip comprises a negative feedback system comprising a multiplier, a loop filter and a VCO connected together to provide the feedback in a loop, wherein the VCO generates a sine wave having a frequency determined by an external applied voltage.

8. A method for growing one or more crystalline materials, comprising:
receiving, continuously and in real-time, microwave plasma input from a microwave plasma reactor, wherein the microwave plasma reactor comprises a Chemical Vapor Deposition (CVD) chamber configured to contain one or more crystalline material seeds having a growing surface configured to grow a crystalline material, wherein the crystalline material requires a defined proposition of plasma constituents to grow; and
controlling, via an Integrated Microwave Generator System (IMGS), a plurality of parameters necessary to maintain the defined proposition of plasma constituents, wherein the plurality of parameters comprises a power density, the IMGS comprising:
a chip-based microwave generator;
a pressure controller;
an IMGS controller;
an optical emission spectrometer (OES) configured to provide a real-time feedback loop to the IMGS controller based on microwave plasma input from the microwave plasma reactor;
a processor;
a non-transitory computer readable medium in electronic communication with the processor; and
instructions stored in the memory, the instructions being executable by the processor to:
receive, continuously and in real-time, microwave plasma input from the microwave plasma reactor;
monitor, continuously and in real-time, a concentration of atomic hydrogen and at least two plasma constituents above the growing surface, wherein the at least two plasma constituents are selected from the group consisting of, OH, $N_2$, CN, H$\delta$, $C_xH_y$, BH, H$\gamma$, CO, $H_2$, $C_2$, H$\beta$, CO+, $O_{2+}$, H$\alpha$, $O_2$, O, and Ar;
generate, in real-time, feedback based on the concentration of the atomic hydrogen and the at least two plasma constituents; and
automatically adjust the power density in response to the feedback to control the atomic hydrogen concentration on the growing surface and to maintain the defined proposition of plasma constituents,
wherein the IMGS is configured to automatically adjust the power density in response to a variation in the atomic hydrogen concentration of 0.25% or less.

* * * * *